United States Patent
Kim

(10) Patent No.: US 7,412,982 B2
(45) Date of Patent: Aug. 19, 2008

(54) CLEANING PROBE AND MEGASONIC CLEANING APPARATUS HAVING THE SAME

(75) Inventor: Sun-Jung Kim, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 565 days.

(21) Appl. No.: 11/240,554

(22) Filed: Oct. 3, 2005

(65) Prior Publication Data

US 2006/0070641 A1  Apr. 6, 2006

(30) Foreign Application Priority Data

Oct. 5, 2004 (KR) .................... 10-2004-0079041

(51) Int. Cl.
*B08B 3/00* (2006.01)
*B08B 3/12* (2006.01)
*B08B 6/00* (2006.01)

(52) U.S. Cl. ............... 134/184; 134/105; 134/137; 134/138; 134/149; 134/151; 134/159; 134/185; 134/187; 134/188; 134/198; 134/902; 438/906

(58) Field of Classification Search ........... 134/105, 134/137, 138, 149, 151, 159, 184, 185, 187, 134/188, 198, 902
See application file for complete search history.

(56) References Cited

U.S. PATENT DOCUMENTS

| 6,039,059 | A | 3/2000 | Bran | |
|---|---|---|---|---|
| 6,543,080 | B1 * | 4/2003 | Tomita et al. | 15/102 |
| 2003/0192571 | A1 * | 10/2003 | Yeo et al. | 134/1.3 |
| 2004/0168707 | A1 * | 9/2004 | Bran et al. | 134/1.3 |
| 2006/0130871 | A1 * | 6/2006 | Hwang et al. | 134/1 |

FOREIGN PATENT DOCUMENTS

| KR | 1020030076898 | 9/2003 |
|---|---|---|
| KR | 1020030081995 | 10/2003 |

* cited by examiner

*Primary Examiner*—Michael Barr
*Assistant Examiner*—Rita R Patel
(74) *Attorney, Agent, or Firm*—Volentine & Whitt, PLLC

(57) ABSTRACT

A cleaning probe capable of providing uniform cleaning to an entire wafer while not damaging the edge portion of the wafer, and a megasonic cleaning apparatus having the cleaning probe are provided. The cleaning probe comprises a front portion located near the center of the wafer, a rear portion connected to a piezoelectric transducer, and a protrusion located between the rear portion and the front portion, located on an edge portion of the wafer, and having a larger cross section width than the front portion.

26 Claims, 10 Drawing Sheets

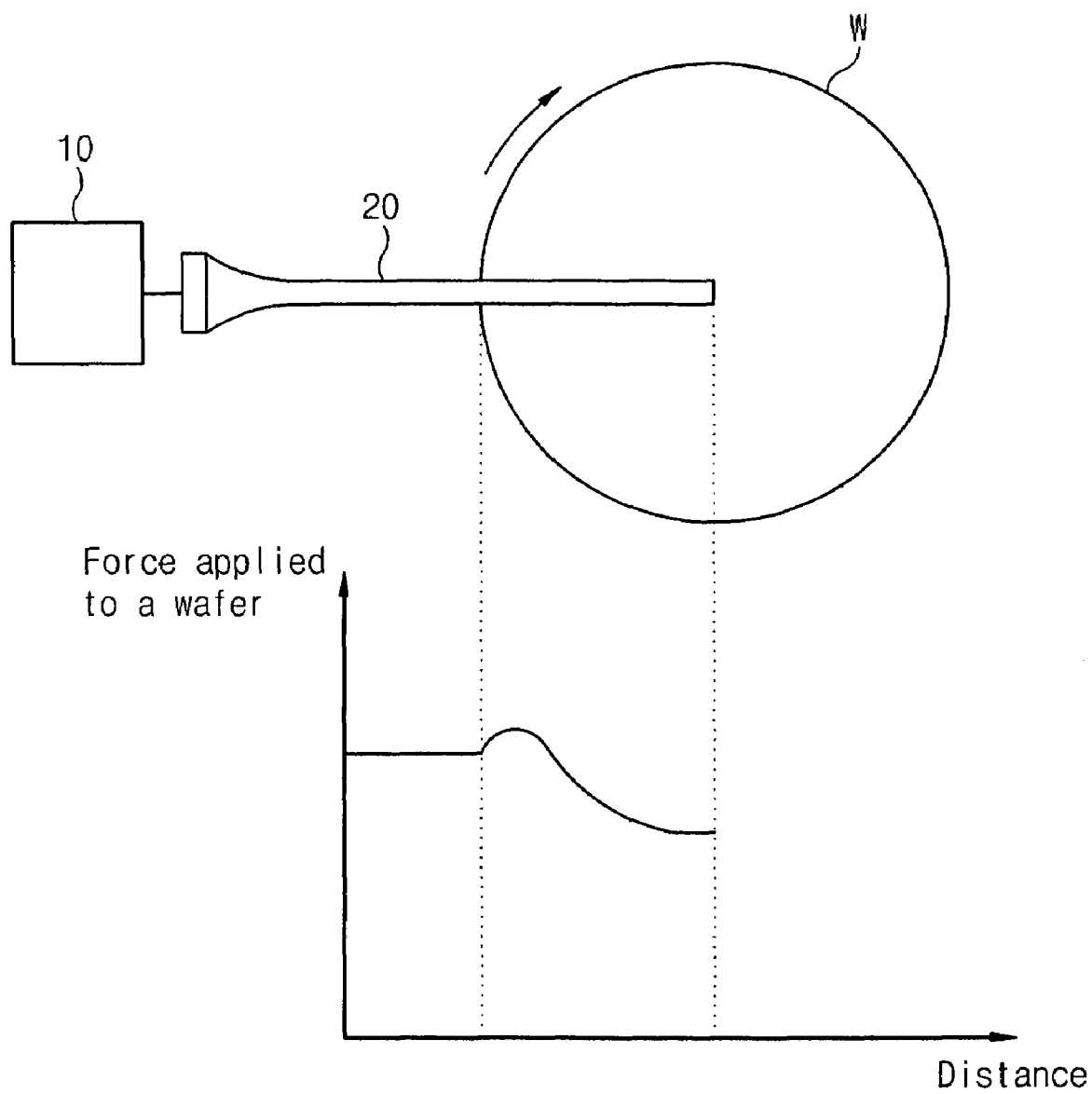

(1)     (2)

(1)  (2)

(1)　　　(2)

CLEANING PROBE AND MEGASONIC CLEANING APPARATUS HAVING THE SAME

BACKGROUND OF THE INVENTION

1. Field of the Invention

The present invention relates generally to a semiconductor manufacturing apparatus, and more particularly, to a cleaning probe adapted for use with a megasonic cleaning apparatus.

This application claims priority to Korean Patent Application 2004-79041 filed on Oct. 5, 2004, the subject matter of which is hereby incorporated by reference.

2. Description of Related Art

The fabrication of a semiconductor device of a wafer involves a complex sequence of individual processes. If particles are allowed to contaminate the surface of the wafer, pattern failures are likely to occur during subsequent processes in the fabrication sequence. These pattern failures are common causes for the ultimate failure of the semiconductor device.

Advances in fabrication and design technologies have allowed the production of semiconductor devices having finer patterns having smaller gaps between patterns sections. As pattern sizes have been diminished and fabrication tolerances have been correspondingly reduced, smaller and smaller particles become potential problems. This trend places additional burdens on cleaning processes adapted to remove potentially contaminating particles from the semiconductor device fabrication environment. Yet, it is increasingly difficult to eliminate smaller and smaller particles using existing cleaning processes, because of relatively strong adhesion forces existing between the particles and the wafer surface.

The need for an improved wafer cleaning process has been recognized for some time now. Several previous attempts have been made to improve the effectiveness of conventional cleaning processes. Some of these methods provide a force to the surface of a wafer in order to overcome the strong adhesive force between the particles and wafer. One such previously proposed method uses a megasonic cleaning apparatus that applies megasonic waves to the wafer being cleaned.

In general, a megasonic cleaning apparatus includes a piezoelectric transducer configured to generate megasonic waves, and a cleaning probe configured to transmit the megasonic waves generated by the piezoelectric transducer onto the surface of the wafer through a cleaning fluid, (e.g., deionized water). The high frequency waves generated by the cleaning probe generate bubbles inside the fluid. As the bubbles impact and burst on the surface of the wafer, the resulting force—formed by the combination of bursting bubbles and fluid displacement (e.g., a directed fluid flow)—vibrate the particles and separate them from the surface of the wafer. This conventional method removes potentially polluting particles from the wafer surface safely and effectively. Indeed, conventional megasonic cleaning processes effectively remove particles from recessed regions of the wafer surface.

FIG. 1 illustrates a conventional cleaning apparatus and a graph illustrating the relative force applied by the conventional cleaning probe along the radial length of a wafer. The conventional megasonic cleaning apparatus illustrated in FIG. 1 is disclosed in U.S. Pat. No. 6,039,059.

Referring to FIG. 1, a conventional cleaning probe 20 contacts a cleaning fluid (not shown) which is uniformly distributed over wafer W. One end of cleaning probe 20 is connected to a piezoelectric transducer 10 and the opposite end of cleaning probe 20 extends over wafer W. Cleaning probe 20 typically takes the shape of a cylindrical rod having a cross section of uniform diameter. High frequency megasonic waves are generated by piezoelectric transducer 10 and transmitted through cleaning probe 20 to the cleaning fluid. The resulting formation and bursting of bubbles upon wafer W removes potentially polluting particles.

FIG. 1 also illustrates the relative force applied at various points across surface of wafer W by cleaning probe 20 through the cleaning fluid. As can be seen, the applied force varies with radial distance from the center of wafer W. That is, the force applied to the surface of wafer W at its outer edge portion is greater than the force applied to the center portions of the wafer.

In effect, the force imparted by the megasonic waves produced by the conventional megasonic cleaning apparatus is concentrated at the edge of wafer W, because much of the energy applied by piezoelectric transducer 10 to cleaning probe 20 dissipates along the length of cleaning probe 20 as it extends away from piezoelectric transducer 10. Given the conventional cleaning probe configuration, if the force of the megasonic waves induced by piezoelectric transducer 10 are increased in order to provide an adequate cleaning effect at a center portion of wafer W, a relatively large force is necessarily applied at the edge portion of wafer W. At some point, these large forces risk damage (e.g., pattern lifting) to components or surface layers formed on the edge portion of wafer W.

SUMMARY OF THE INVENTION

In one embodiment, the invention provides a megasonic cleaning apparatus comprising a cleaning vessel, a rotation table located in the cleaning vessel and adapted to support a wafer placed on the rotation table, a rotation axis connected to a bottom of the rotation table, a motor connected to the rotation axis and configured to rotate the rotation table, a cleaning probe located over the rotation table and the wafer and configured to transmit megasonic waves to a surface of the wafer via a cleaning fluid on the surface of the wafer, a piezoelectric transducer connected to the cleaning probe and configured to generate megasonic waves, and a cleaning fluid supplying tube configured to supply cleaning fluid onto the wafer, wherein the cleaning probe comprises a rear portion connected to the piezoelectric transducer, a front portion located opposite the rear portion and located over the wafer, and a protrusion located between the rear portion and the front portion, and located over an edge portion of the wafer, wherein a cross section width of the protrusion is larger than a cross section width of the front portion.

In another embodiment, the invention provides a cleaning probe used in an apparatus for cleaning a wafer using megasonic waves comprising a rear portion connected to a piezoelectric transducer configured to generate megasonic waves, a front portion located opposite to the rear portion and located over the wafer, and a protrusion located between the rear portion and the front portion, and located at an edge portion of the wafer, wherein a cross section width of the protrusion is larger than a cross section width of the front portion.

BRIEF DESCRIPTION OF THE DRAWINGS

Exemplary embodiments of the invention are described below with reference to the attached drawings in which like reference symbols indicate like or similar components. In the drawings:

FIG. 1 shows a conventional cleaning apparatus and the magnitude of the force applied to points on the surface of the wafer in accordance with the distance of the points from the edge of the wafer;

DESCRIPTION OF THE EXEMPLARY EMBODIMENTS

Figure 2A:
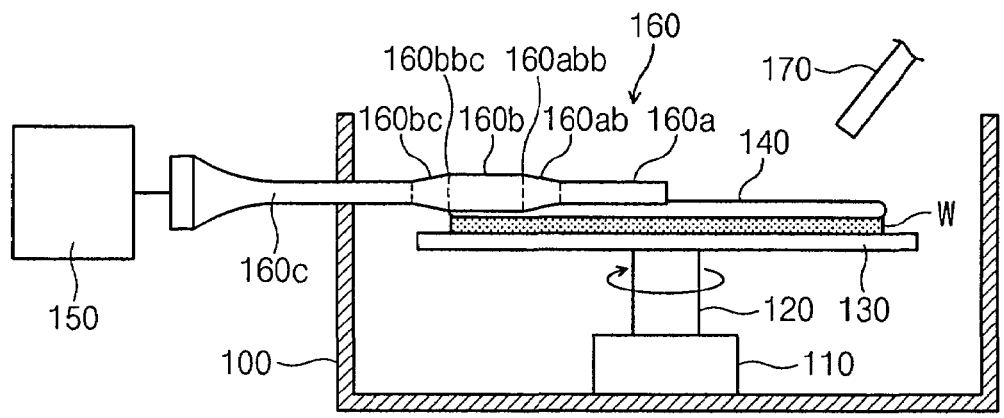
FIG. 2A shows cross-sectional view of a megasonic cleaning apparatus in accordance with one embodiment of the present invention.
Figure 2B:
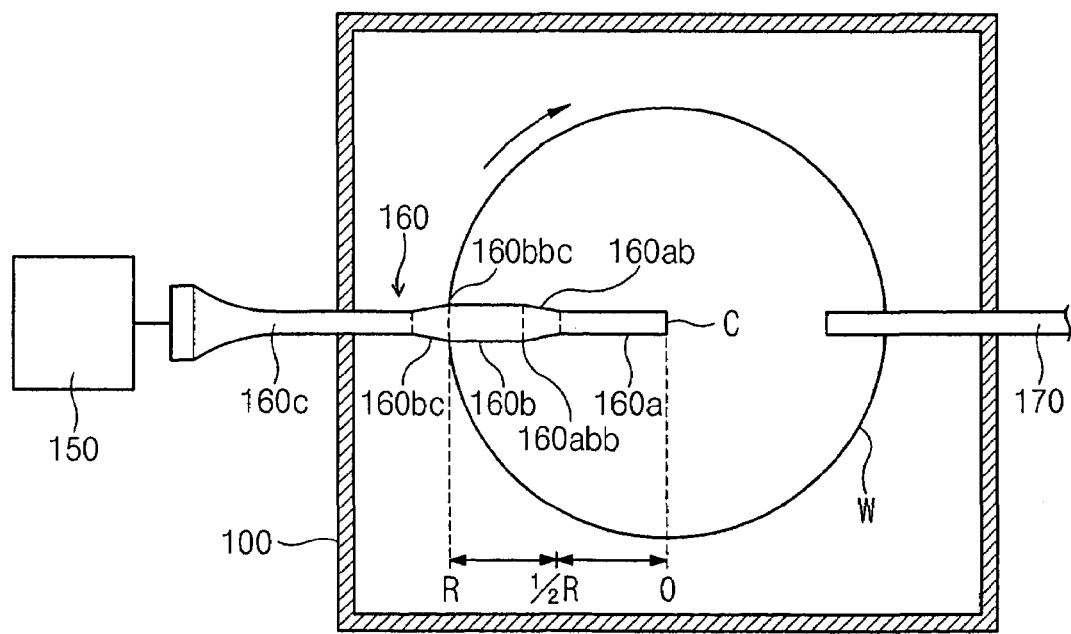
FIG. 2B shows a plan view of the megasonic cleaning apparatus from above in accordance with one embodiment of the present invention.

Referring to FIGS. 2A and 2B, the megasonic cleaning apparatus comprises cleaning vessel 100. Rotation table 130, which supports wafer W, is located in cleaning vessel 100. Rotation table 130 is rotated by rotation axis 120 connected to motor 110. Cleaning fluid 140 is applied to the surface of wafer W mounted on rotation table 130 by cleaning fluid supplying tube 170. Cleaning probe 160 projects through a sidewall of cleaning vessel 100 to a position above rotation table 130. Cleaning probe 160 is connected to piezoelectric transducer 150 located outside cleaning vessel 100. Piezoelectric transducer 150 generates megasonic waves having frequencies ranging from, for example, 750 to 1000 kHz.

Cleaning probe 160 comprises a front portion 160a located near center C of wafer W, a rear portion 160c connected to piezoelectric transducer 150, and a protrusion 160b located between front portion 160a and rear portion 160c. Protrusion 160b is characterized by having a larger cross section width than front portion 160a. Cross section width is defined as the diameter of the cross section if the cross section is circular, or, if the cross section is elliptical, the length of the semimajor axis or the individual lengths of each of the semimajor and semiminor axes. In the illustrated example, protrusion 160b has a circular or an elliptical cross section. A rear connection portion 160bc is located between rear portion 160c and protrusion 160b and has a cross section width that varies along its length. A front connection portion 160ab is located between front portion 160a and protrusion 160b and has a cross section width that varies along its length. An end of front portion 160a may be located, for example, at center C of wafer W. A front protruding boundary 160abb is a boundary between front connection portion 160ab and protrusion 160b, and is preferably located at a distance, as measured from center C of wafer W, which is greater than or equal to half of the radius R of wafer W. A rear protruding boundary 160bbc, which is a boundary between protrusion 160b and rear connection portion 160bc, is preferably located at a distance, measured from center C of wafer W, which is greater than or equal to radius R of the wafer.

The method of operating the megasonic cleaning apparatus includes the following steps. Wafer W is placed on rotation table 130. Rotation table 130 is rotated by motor 110, and cleaning fluid 140, such as deionized water, is supplied to the surface of wafer W through cleaning fluid supplying tube 170. Wafer W is rotated together with rotation table 130, and cleaning fluid 140 supplied to wafer W is distributed over the entire surface of wafer W with a uniform thickness. Cleaning probe 160, connected to piezoelectric transducer 150, is located on wafer W, and cleaning probe 160 contacts cleaning fluid 140 but does not directly contact the surface of wafer W. Megasonic waves with an exemplary frequency of 900 kHz are generated in piezoelectric transducer 150, and the megasonic waves are transmitted to cleaning probe 160 and then transmitted to the surface of wafer W through cleaning fluid 140.

Figure 3:
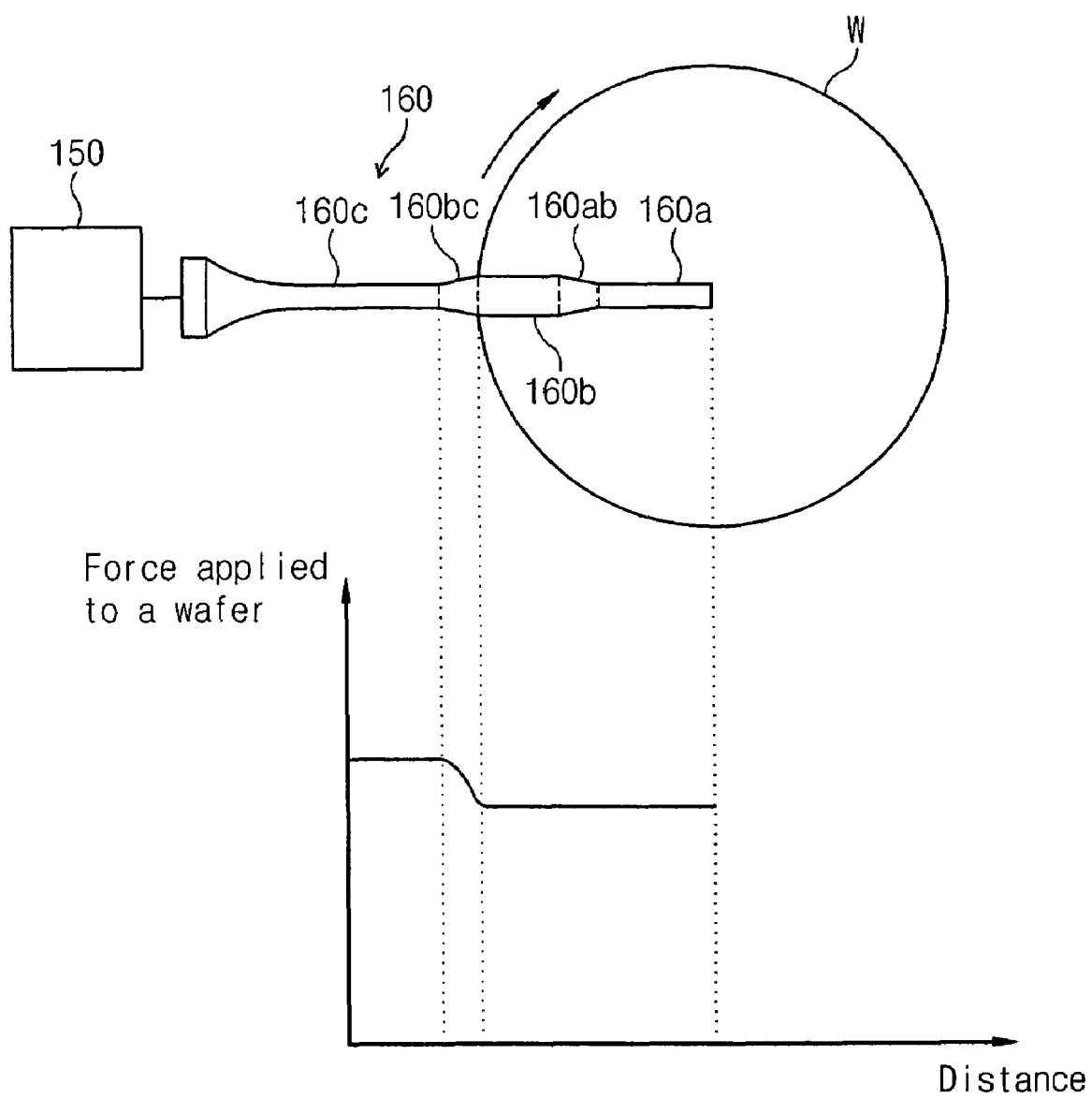
FIG. 3 shows a megasonic cleaning apparatus and the magnitude of the force applied to points on the surface of the wafer in accordance with the distance of the points from the edge of the wafer, in accordance with one embodiment of the present invention.

The force of the megasonic waves transmitted to the surface of wafer W does not vary over the surface of wafer W, but is uniform throughout the entire wafer as shown in FIG. 3. Referring to FIG. 3, the force of the megasonic waves transmitted through cleaning probe 160 is decreased, relative to the force of the megasonic waves transmitted at corresponding regions of conventional cleaning probe 20 of FIG. 1, by the increasing cross section width over the length of rear connection portion 160bc and the large cross section width of protrusion 160b so that the force of the megasonic waves is applied uniformly to the entire wafer W.

Figure 4:
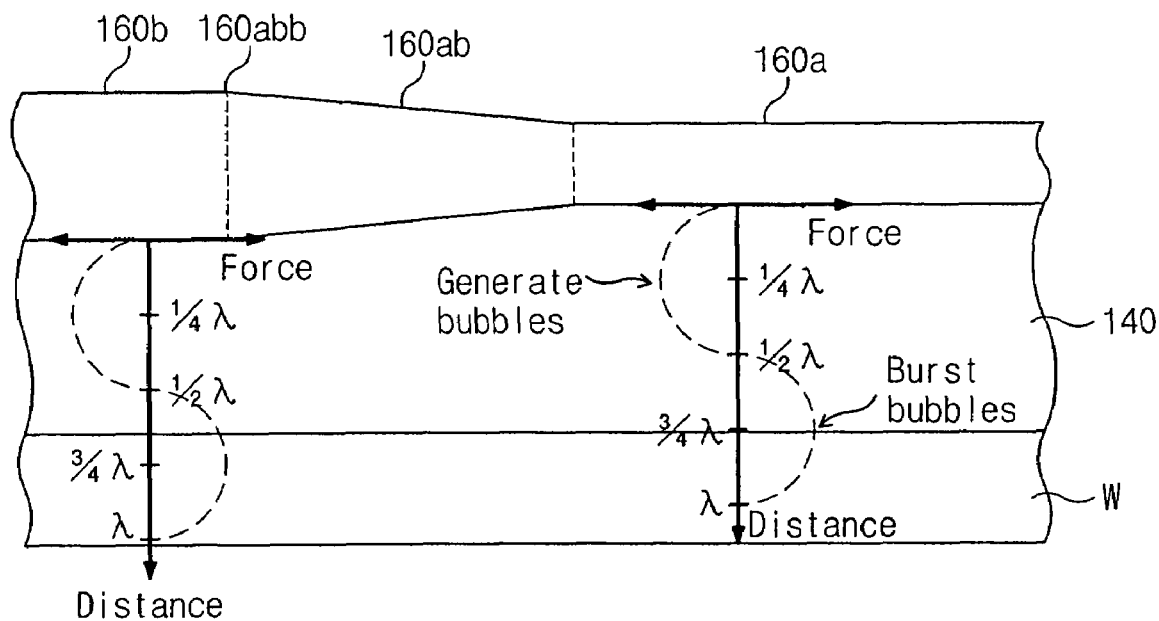
FIG. 4 shows the force of a wave in accordance with the gap between the cleaning probe and the surface of the wafer.
Figure 5:
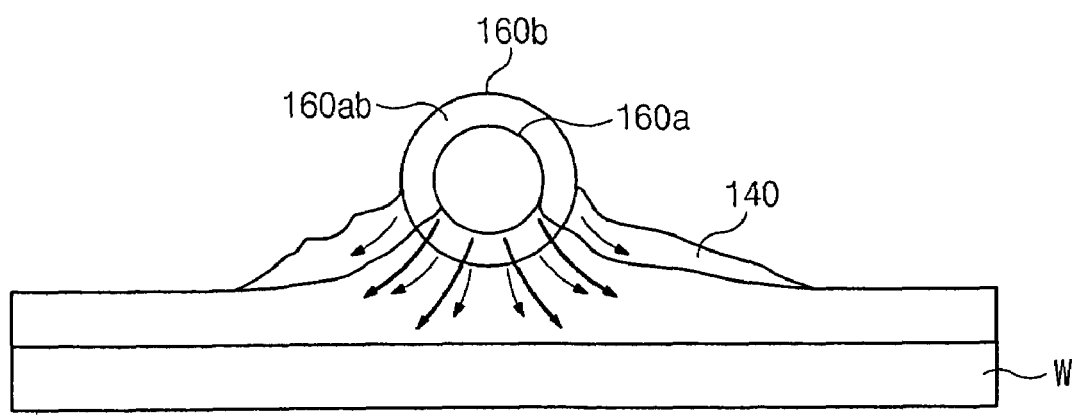
FIG. 5 shows a right-side view of the cleaning probe and shows the state in which the cleaning probe contacts the cleaning fluid on the wafer in accordance with one embodiment of the present invention.

The following three principles, with reference to FIGS. 4 and 5, may describe the decrease in the force of the megasonic waves applied to the surface of wafer W caused by wide protrusion 160b, as shown in the graph of FIG. 3.

First, protrusion 160b, with its relatively large cross section width, functions as a damper by decreasing the force of the megasonic waves due to its relatively large unit volume. The same principle that governs the difference in the amplitude of vibration of a bar with a weight at its end and a bar without a weight governs this phenomenon. The bar with the weight on the end will have a lesser amplitude when vibrated, and likewise protrusion 160b with a relatively larger unit volume will cause a smaller force of the megasonic waves to be applied than protrusion 160b with a relatively smaller unit volume.

Second, referring to FIG. 4, according to a general cavitation phenomenon, if a cycle with a wavelength of λ in a wave is produced, bubbles are generated and then burst. In the megasonic cleaning apparatus, polluting particles are removed from the wafer surface when bubbles are burst. As shown in FIG. 4, bubbles are generated at the ¼ λ point of the wave, and burst at the ¾ λ point of the wave. Accordingly, front portion 160a should be separated a distance of ¾ λ from the surface of wafer W so that the point of the wave where the force that bursts bubbles is at a maximum is at the surface of wafer W. The preceding arrangement increases the cleaning force at the center portion of wafer W, which is where the cleaning force is conventionally the least strong, as shown in FIG. 1. Since the force of the wave transmitted to the edge portion of wafer W is conventionally the strongest, the gap between cleaning probe 160 and the edge portion of wafer W is reduced in order to decrease the cleaning force at the edge portion of wafer W. In more detail, the relatively large cross section width of protrusion 160b decreases the gap between protrusion 160b and the edge portion of wafer W, as shown in FIG. 4, so the force of the megasonic wave does not reach the ¾ λ point of the wave at the surface of wafer W, and thus the force that bursts the bubbles is below the maximum force at the edge portion. Therefore, the force of the megasonic waves at the edge portion of the surface of wafer W is less than the force of the megasonic waves at the edge portion of the surface of wafer W in the conventional cleaning apparatus.

Third, referring to FIG. 5, protrusion 160b has a larger cross section width than front portion 160a. In FIG. 5, the arc length of the cross section of the surface where front portion 160a contacts cleaning fluid 140 is shorter than the arc length of the cross section of the surface where protrusion 160b contacts cleaning fluid 140. Thus, the unit area of protrusion 160b that contacts the cleaning fluid 140 is larger than the unit area of front portion 160a that contacts cleaning fluid 140. Accordingly, even if megasonic waves of the same force were transmitted to both front portion 160a and protrusion 160b to be applied to the surface of wafer W, the force of the megasonic waves (represented as small arrows) transmitted to the surface of the wafer W through the lower portion of protrusion 160b would be dispersed over a larger unit area than the waves applied through front portion 160a, and so the force of the megasonic waves transmitted through protrusion 160b would be less than the force of the megasonic waves transmitted through front portion 160a.

Cleaning probe 160, according to one embodiment and based on the above three principles, has protrusion 160b with a large cross section width and may decrease the force of the megasonic waves transmitted to the edge portion of the wafer. Accordingly, it is possible to provide a uniform cleaning to the entire surface of the wafer as shown in FIG. 3.

Figure 6A:
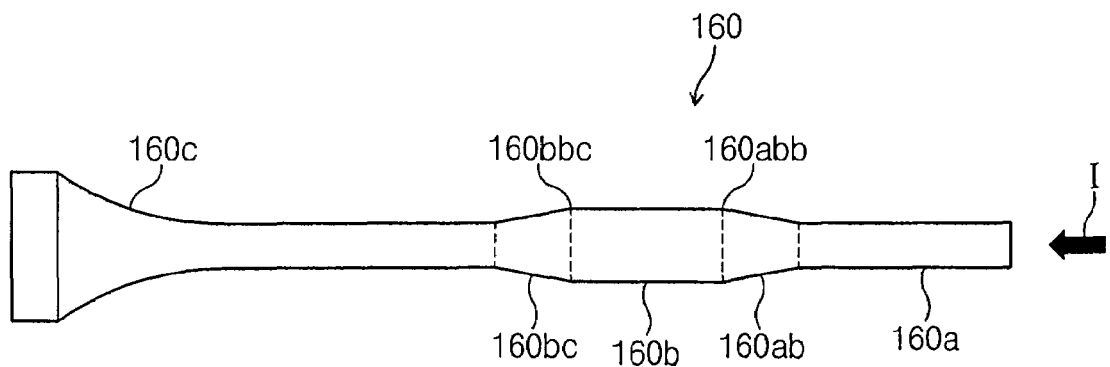
FIG. 6A shows a front view of a cleaning probe in accordance with one embodiment of the present invention.
Figure 6B:
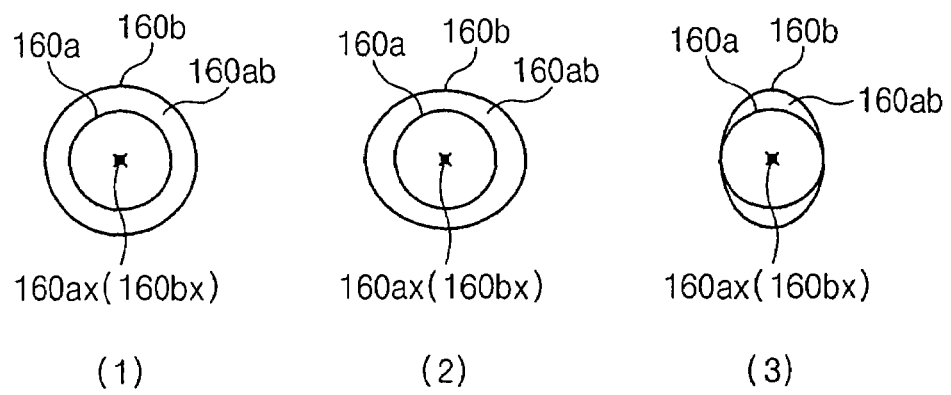
FIG. 6B shows right side-views of the cleaning probe shown in FIG. 6A from the direction of arrow I in accordance with several embodiments of the present invention.

Referring to FIGS. 6A and 6B, protrusion 160b has a larger cross section width than front portion 160a. The cross section of protrusion 160b may be circular as in FIG. 6B (1) or elliptical as in FIGS. 6B (2) and (3). The ellipse either has the major axis in the horizontal direction, as in FIG. 6B (2), or in the vertical direction, as in FIG. 6B (3). In the embodiments shown, center 160bx of the cross section of protrusion 160b is on the same axis as center 160ax of the cross section of front portion 160a. In FIG. 6B (1), the cross section of protrusion 160b has a larger diameter than front portion 160a. In FIG. 6B (2), the major axis, which is in the horizontal direction, and the minor axis of the cross section of protrusion 160b are both larger than the diameter of front portion 160a, while in FIG. 6B (3) only the major axis of protrusion 160b, which is in the vertical direction, is larger than the diameter of front portion 160a.

Figure 7A:
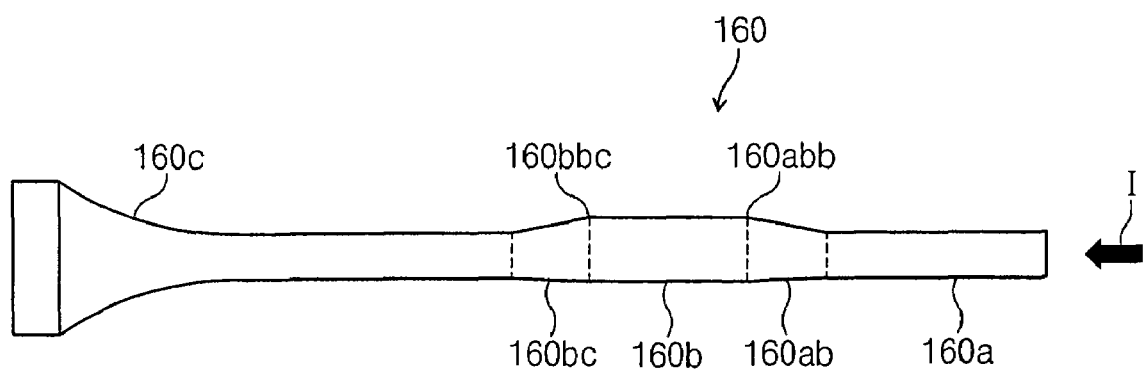
FIG. 7A shows a front view of a cleaning probe in accordance with another embodiment of the present invention.
Figure 7B:
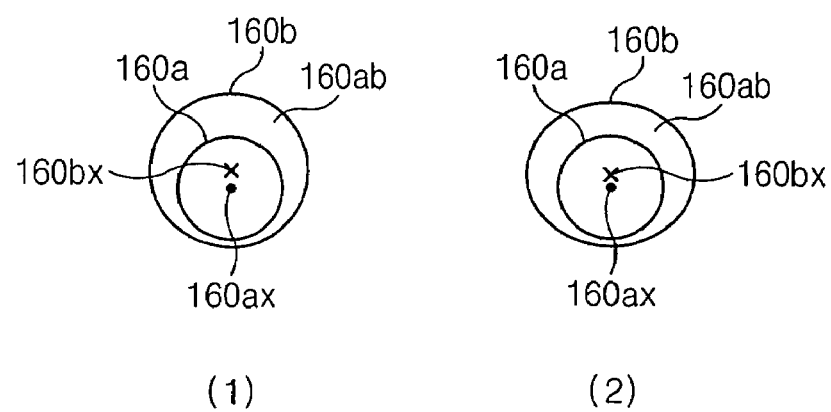
FIG. 7B shows right side-views of the cleaning probe shown in FIG. 7A from the direction of arrow I in accordance with several embodiments of the present invention.

Referring to FIGS. 7A and 7B, protrusion 160b has a larger cross section width than front portion 160a. The cross section of protrusion 160b may be circular as in FIG. 7B (1), or elliptical as in FIG. 7B (2). In the embodiments shown, center 160bx of the cross section of protrusion 160b is not on the same axis as center 160ax of the cross section of front portion 160a. Center 160bx of the cross section of protrusion 160b is located higher than center 160ax of the cross section of front portion 160a. In FIG. 7B (1), the cross section of protrusion 160b has a greater diameter than the cross section of front portion 160a. In FIG. 7B (2), the major axis, which is in the horizontal direction, and the minor axis of the cross section of protrusion 160b are both larger than the diameter of the cross section of front portion 160a.

Figure 8A:
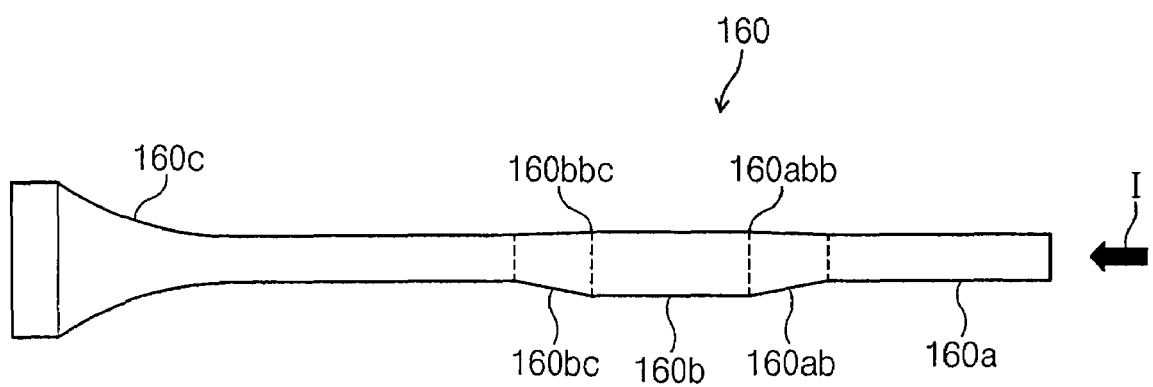
FIG. 8A shows a front view of a cleaning probe in accordance with still another embodiment of the present invention.
Figure 8B:
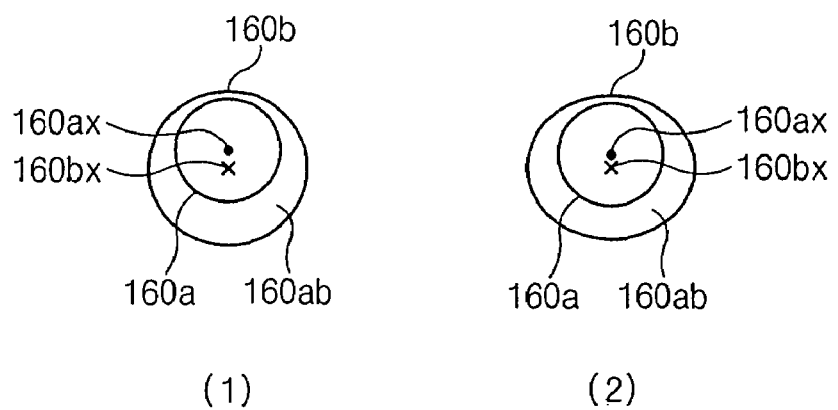
FIG. 8B shows right side-views of the cleaning probe shown in FIG. 8A from the direction of arrow I in accordance with several embodiments of the present invention.

Referring to FIGS. 8A and 8B, protrusion 160b has a larger cross section width than front portion 160a. The cross section of protrusion 160b may be circular as in FIG. 8B (1), or elliptical as in FIG. 8B (2). In the embodiments shown, center 160bx of the cross section of protrusion 160b is not on the same axis as center 160ax of the cross section of front portion 160a. Center 160bx of the cross section of protrusion 160b is located lower than center 160ax of the cross section of front portion 160a. In FIG. 8B (1), the cross section of protrusion 160b has a greater diameter than the cross section of front portion 160a. In FIG. 8B (2), the major axis, which is in the horizontal direction, and the minor axis of the cross section of protrusion 160b are both larger than the diameter of the cross section of front portion 160a.

Figure 9A:
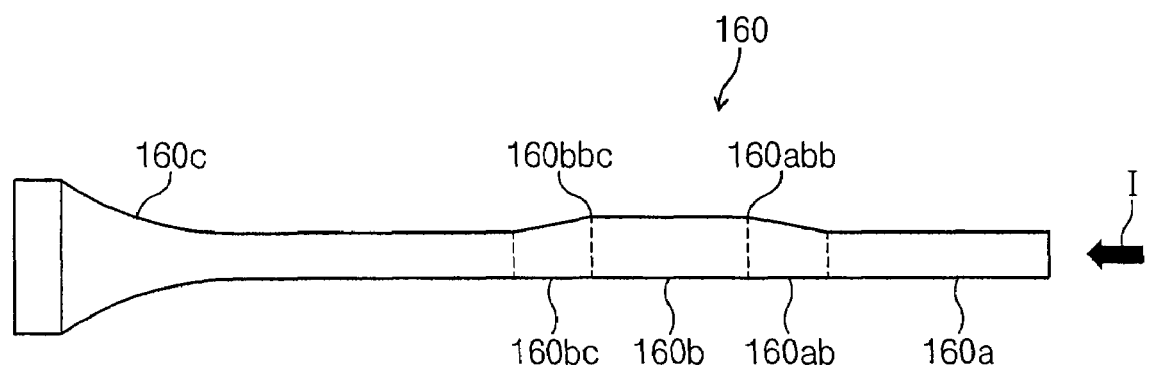
FIG. 9A shows a front view of a cleaning probe in accordance with yet another embodiment of the present invention.
Figure 9B:
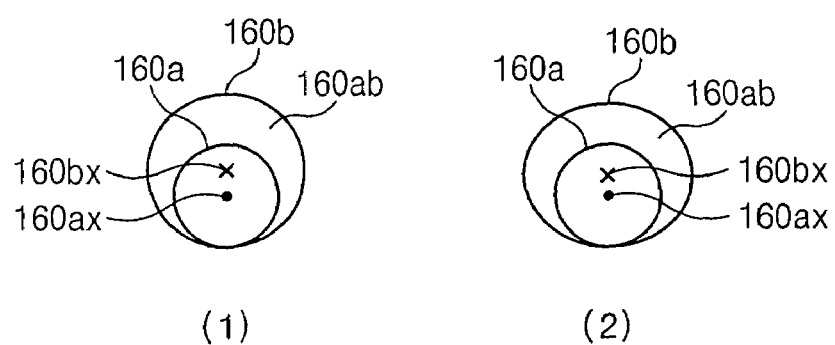
FIG. 9B shows right side-views of the cleaning probe shown in FIG. 9A from the direction of arrow I in accordance with several embodiments of the present invention.

Referring to FIGS. 9A and 9B, protrusion 160b has a larger cross section width than front portion 160a. According to the front view of FIG. 9A, the lowest portions of front portion 160a, front connection portion 160ab, protrusion 160b and rear connection portion 160bc are all located on the same line. The cross-section of protrusion 160b may be circular as in FIG. 9B (1), or elliptical as in FIG. 9B (2). In the embodiments shown, center 160bx of the cross-section of protrusion 160b is not on the same axis as center 160ax of the cross-section of front portion 160a. Center 160bx of the cross-section of protrusion 160b is located higher than center 160ax of the cross-section of front portion 160a. If cleaning probe 160, according to the embodiments shown, is applied to a megasonic cleaning apparatus, it is possible to prevent an edge portion of a wafer from being damaged by the effects of the first and third principles mentioned previously. In FIG. 9B (1), the cross section of protrusion 160b has a greater diameter than the cross section of front portion 160a. In FIG. 9B (2), the major axis, which is in the horizontal direction, and the minor axis of the cross section of protrusion 160b are both larger than the diameter of the cross section of front portion 160a.

Figure 10A:
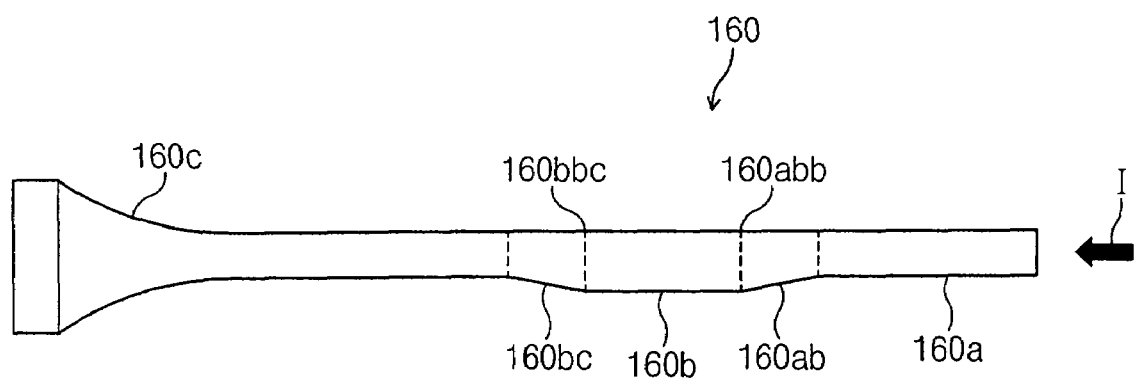
FIG. 10A shows a front view of a cleaning probe in accordance with still another embodiment of the present invention.
Figure 10B:
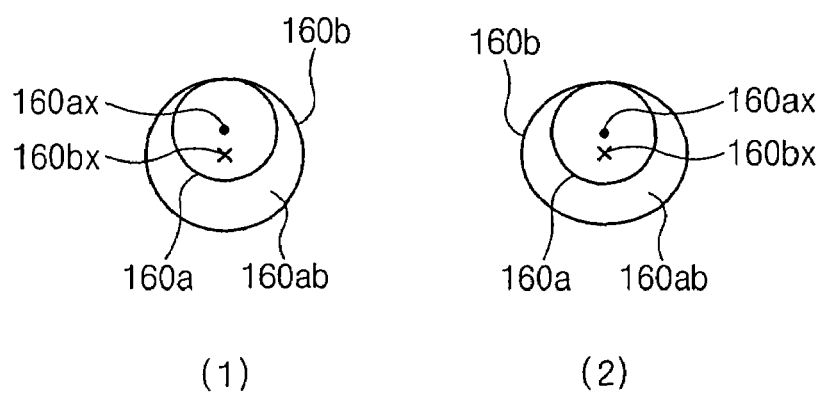
FIG. 10B shows right side-views of the cleaning probe shown in FIG. 10A from the direction of arrow I in accordance with several embodiments of the present invention.

Referring to FIGS. 10A and 10B, protrusion 160b has a larger cross section width than front portion 160a. According to the front view of FIG. 10A, the highest portions of front portion 160a, front connection portion 160ab, protrusion 160b and rear connection portion 160bc are all located on the same line. The cross-section of protrusion 160b may be circular as in FIG. 10B (1), or elliptical as in FIG. 10B (2). In the embodiments shown, center 160bx of the cross section of protrusion 160b is not on the same axis as center 160ax of the cross section of front portion 160a. Center 160bx of the cross-section of protrusion 160b is located lower than center 160ax of the cross section of front portion 160a. In FIG. 10B (1), the cross section of protrusion 160b has a greater diameter than the cross section of front portion 160a. In FIG. 10B (2), the major axis, which is in the horizontal direction, and the minor axis of the cross section of protrusion 160b are both larger than the diameter of the cross section of front portion 160a.

Figure 11A:
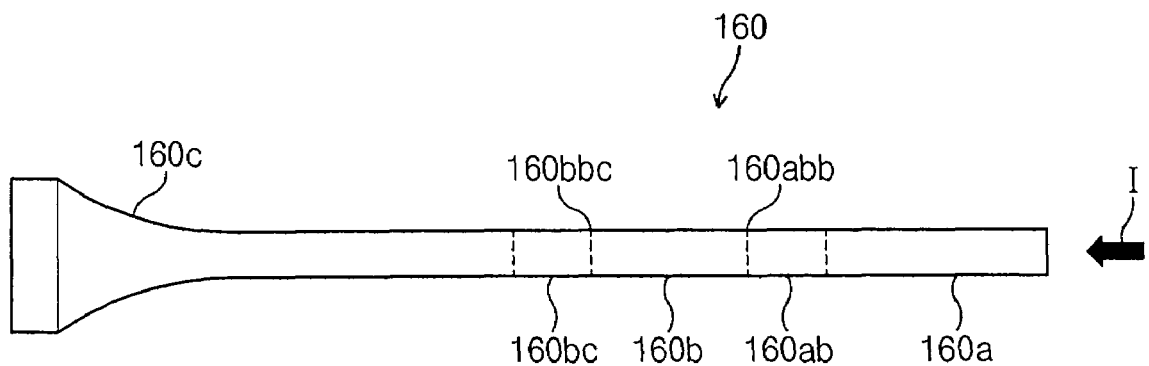
FIG. 11A shows a front view of a cleaning probe in accordance with yet another embodiment of the present invention; and, FIG. 11B shows a right side-view of the cleaning probe shown in FIG. 11A from the direction of arrow I.
Figure 11B:
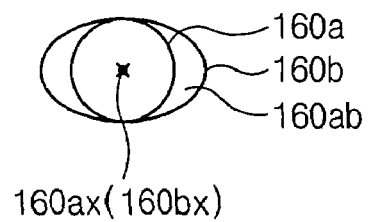

Referring to FIGS. 11A and 11B, protrusion 160b has a larger cross section width than front portion 160a. According to the front view of FIG. 11A, the highest portions of front portion 160a, front connection portion 160ab, protrusion 160b, and rear connection portion 160bc are all located on the same line. Also, according to the front view of FIG. 11A, the lowest portions of front portion 160a, front connection portion 160ab, protrusion 160b, and rear connection portion 160bc are all located on the same line. In the embodiment shown, center 160bx of the cross-section of protrusion 160b is on the same axis as center 160ax of the cross section of front portion 160a. In FIG. 11B, the major axis of the cross section of protrusion 160 is greater than the diameter of the cross section of front portion 160a. The major axis of the cross section of protrusion 160b is in the horizontal direction.

Therefore, using a megasonic cleaning apparatus according to the present invention comprising a cleaning probe having a protrusion located on an edge portion of a wafer, it is possible to decrease the force of the megasonic waves applied to the edge portion of a wafer, thereby preventing the cleaning apparatus from damaging the edge portion of the wafer. Furthermore, it is possible to provide uniform cleaning to an entire wafer.

The invention has been described with reference to exemplary embodiments; however, those of ordinary skill in the art will understand that the invention is not limited to the disclosed embodiments, but that various modifications and similar arrangements are within the scope of the invention as set forth in the following claims.

What is claimed is:

1. A megasonic cleaning apparatus comprising:
   a cleaning vessel;
   a rotation table located in the cleaning vessel and adapted to support a wafer placed on the rotation table;
   a rotation axis connected to a bottom of the rotation table;
   a motor connected to the rotation axis and configured to rotate the rotation table;
   a cleaning probe located over the rotation table and the wafer and configured to transmit megasonic waves to a surface of the wafer via a cleaning fluid on the surface of the wafer;
   a piezoelectric transducer connected to the cleaning probe and configured to generate megasonic waves; and,
   a cleaning fluid supplying tube configured to supply cleaning fluid onto the wafer, wherein the cleaning probe comprises a rear portion connected to the piezoelectric transducer, a front portion located opposite the rear portion and located over the wafer, and a protrusion located between the rear portion and the front portion, and located over an edge portion of the wafer, wherein a cross section width of the protrusion is larger than a cross section width of the front portion.

2. The apparatus of claim 1, wherein the cleaning probe further comprises:
   a front connection portion connecting the protrusion and the front portion, wherein a cross section width of the front connection portion varies over a length of the front connection portion; and,
   a rear connection portion connecting the protrusion and the rear portion, wherein a cross section width of the rear connection portion varies over a length of the rear connection portion.

3. The apparatus of claim 2, wherein a boundary between the rear connection portion and the protrusion is located at a distance, measured from a center of the wafer, which is greater than or equal to a radius of the wafer.

4. The apparatus of claim 3, wherein a boundary between the front connection portion and the protrusion is located at a distance, measured from the center of the wafer, which is greater than or equal to half of the radius of the wafer.

5. The apparatus of claim 4, wherein a cross section of the protrusion is circular.

6. The apparatus of claim 5, wherein a center of the cross section of the protrusion is on a same axis as a center of a cross section of the front portion.

7. The apparatus of claim 5, wherein a center of the cross section of the protrusion is not on a same axis as a center of a cross section of the front portion.

8. The apparatus of claim 7, wherein the center of the cross section of the protrusion is higher than the center of the cross section of the front portion.

9. The apparatus of claim 7, wherein the center of the cross section of the protrusion is lower than the center of the cross section of the front portion.

10. The apparatus of claim 4, wherein a cross section of the protrusion is elliptical.

11. The apparatus of claim 10, wherein a center of the cross section of the protrusion is on a same axis as a center of a cross section of the front portion.

12. The apparatus of claim 10, wherein a center of the cross section of the protrusion is not on a same axis as a center of a cross section of the front portion.

13. The apparatus of claim 12, wherein the center of the cross section of the protrusion is higher than the center of the cross section of the front portion.

14. The apparatus of claim 12, wherein the center of the cross section of the protrusion is lower than the center of the cross section of the front portion.

15. A cleaning probe used in an apparatus for cleaning a wafer using megasonic waves comprising:
    a rear portion connected to a piezoelectric transducer configured to generate megasonic waves;
    a front portion located opposite to the rear portion and located over the wafer; and,
    a protrusion located between the rear portion and the front portion, and located at an edge portion of the wafer,
    wherein a cross section width of the protrusion is larger than a cross section width of the front portion.

16. The cleaning probe of claim 15, wherein the cleaning probe further comprises:
    a front connection portion connecting the protrusion and the front portion, wherein a cross section width of the front connection portion varies over a length of the front connection portion; and,
    a rear connection portion connecting the protrusion and the rear portion, wherein a cross section width of the rear connection portion varies over a length of the rear connection portion.

17. The cleaning probe of claim 16, wherein a cross section of the protrusion is circular.

18. The cleaning probe of claim 17, wherein a center of the cross section of the protrusion is on a same axis as a center of a cross section of the front portion.

19. The cleaning probe of claim 17, wherein a center of the cross section of the protrusion is not on a same axis as a center of a cross section of the front portion.

20. The cleaning probe of claim 19, wherein the center of the cross section of the protrusion is higher than the center of the cross section of the front portion.

21. The cleaning probe of claim 19, wherein the center of the cross section of the protrusion is lower than the center of the cross section of the front portion.

22. The cleaning probe of claim 16, wherein a cross section of the protrusion is elliptical.

23. The cleaning probe of claim 22, wherein a center of the cross section of the protrusion is on a same axis as a center of a cross section of the front portion.

24. The cleaning probe of claim 22, wherein a center of the cross section of the protrusion is not on a same axis as a center of a cross section of the front portion.

25. The cleaning probe of claim 24, wherein the center of the cross section of the protrusion is higher than the center of the cross section of the front portion.

26. The cleaning probe of claim 24, wherein the center of the cross section of the protrusion is lower than the center of the cross section of the front portion.

* * * * *